United States Patent
Satake et al.

(10) Patent No.: US 11,353,894 B2
(45) Date of Patent: Jun. 7, 2022

(54) LIQUID PROCESSING APPARATUS AND LIQUID PROCESSING METHOD

(71) Applicant: Tokyo Electron Limited, Tokyo (JP)

(72) Inventors: Keigo Satake, Kumamoto (JP); Hiroshi Komiya, Kumamoto (JP); Kouji Ogura, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 524 days.

(21) Appl. No.: 15/659,750

(22) Filed: Jul. 26, 2017

(65) Prior Publication Data
US 2018/0032092 A1 Feb. 1, 2018

(30) Foreign Application Priority Data

Jul. 27, 2016 (JP) .............................. JP2016-147689

(51) Int. Cl.
*G05D 7/01* (2006.01)
*H01L 21/67* (2006.01)
*G05D 7/06* (2006.01)

(52) U.S. Cl.
CPC ............. *G05D 7/01* (2013.01); *G05D 7/0635* (2013.01); *H01L 21/67017* (2013.01); *H01L 21/67051* (2013.01); *H01L 21/67253* (2013.01)

(58) Field of Classification Search
CPC ......... H01L 21/67017; H01L 21/67051; H01L 21/67053; B01L 2200/143; G05D 7/0635;
(Continued)

(56) References Cited

U.S. PATENT DOCUMENTS 3,454,037 A * 7/1969 Cornforth ............ G05D 7/0635
137/487.5
3,707,978 A * 1/1973 Volk, Jr. ................. F16K 31/00
137/2
(Continued)

FOREIGN PATENT DOCUMENTS

| JP | H11-345002 A | 12/1999 |
| JP | 2010-123709 A | 6/2010 |
| JP | 2015-213145 A | 11/2015 |

OTHER PUBLICATIONS

Definition of "interval" available Sep. 28, 2021 from Dictionary.com, at www.dictionary.com/browse/interval, 1 page (Year: 2021).*

*Primary Examiner* — Keath T Chen
*Assistant Examiner* — Margaret D Klunk
(74) *Attorney, Agent, or Firm* — Abelman, Frayne & Schwab

(57) ABSTRACT

A liquid processing apparatus includes: a substrate processing unit; a supply line that supplies the fluid to the substrate processing unit; a flow meter that measures a flow rate of the fluid flowing through the supply line; a flow rate adjustment mechanism that adjusts the flow rate of the fluid flowing through the supply line; and a controller that control the flow rate adjustment mechanism based on a measurement result of the flow meter. The controller receives the measurement result at a first cycle. When the measurement result of the flow meter indicates that the flow rate of the fluid flowing through the supply line is included in a preset range, the controller causes the flow rate adjustment mechanism to adjust the flow rate of the fluid flowing through the supply line at a cycle having a time interval longer than a time interval of the first cycle.

8 Claims, 5 Drawing Sheets

(58) Field of Classification Search
CPC .. G05D 7/0676; G05D 11/132; G05D 7/0617; G05D 16/2013; G05D 7/0623
See application file for complete search history.

(56) References Cited

U.S. PATENT DOCUMENTS

| | | | |
|---|---|---|---|
| 2007/0276545 A1* | 11/2007 | Smirnov | G05D 7/0635 |
| | | | 700/282 |
| 2011/0253244 A1* | 10/2011 | Lord | F16L 11/085 |
| | | | 138/124 |
| 2012/0160279 A1* | 6/2012 | Konishi | H01L 21/67051 |
| | | | 134/99.1 |
| 2016/0246307 A1* | 8/2016 | Nogami | H01L 21/67051 |

* cited by examiner

1

LIQUID PROCESSING APPARATUS AND LIQUID PROCESSING METHOD

CROSS-REFERENCE TO RELATED APPLICATIONS

This application is based on and claims priority from Japanese Patent Application No. 2016-147689, filed on Jul. 27, 2016 with the Japan Patent Office, the disclosure of which is incorporated herein in its entirety by reference.

TECHNICAL FIELD

The present disclosure relates to a light source device and a vehicle lamp.

BACKGROUND

A method of rotating a substrate held in a horizontal position around a vertical axis to supply a rinsing liquid such as, for example, diluted hydrofluoric acid (DHF) or a rinsing liquid such as, for example, deionized water (DIW) to a treatment surface of the substrate is generally adopted in order to perform a liquid processing such as, for example, a chemical liquid processing or a rinsing processing on the substrate such as, for example, a semiconductor wafer. In this method, the flow rate of a liquid flowing through a supply line is adjusted by a flow rate adjustment mechanism so as to make the flow rate close to a preset flow rate, thereby supplying the preset amount of a liquid to the substrate. Various valve bodies may be used as the flow rate adjustment mechanism, and typically, a flow rate control valve called a needle valve may be used appropriately (see, e.g., Japanese Patent Laid-open Publication No. 2015-213145).

By measuring the flow rate by a flow meter while performing a feedback control of the flow rate adjustment mechanism based on the measurement result, a preset amount of a liquid can be stably supplied to a substrate. This flow rate adjustment is constantly performed while the liquid is supplied to the substrate.

Meanwhile, the flow rate adjustment mechanism is provided with, for example, a valve body that performs a mechanical operation, and as a result, as the number of times of the operation increases, each component deteriorates and the accuracy of the flow rate adjustment drops, which may cause the flow rate of the liquid not to be appropriately adjusted. Therefore, it is required to predict the life of the flow rate adjustment mechanism and to exchange the flow rate adjustment mechanism before reaching the end of the life. In particular, in the case where an extremely high flow rate adjustment in, for example, a liquid processing of a semiconductor wafer is required, the opening/closing operation of the valve body is performed by the flow rate adjustment mechanism in a very short cycle (e.g., a cycle of 0.5 seconds). Therefore, since the life of the flow rate adjustment mechanism tends to decrease as the number of operation times of the flow rate adjustment mechanism increases, there is a demand to reduce the frequency of exchanging the flow rate adjustment mechanism.

SUMMARY

The present disclosure relates to a liquid processing apparatus that includes a substrate processing unit configured to supply a fluid to a substrate, a supply line configured to supply the fluid to the substrate processing unit, a flow meter configured to measure a flow rate of the fluid flowing through the supply line, a flow rate adjustment mechanism provided in the supply line and configured to adjust the flow rate of the fluid flowing through the supply line, and a controller configured to control the flow rate adjustment mechanism based on a measurement result of the flow meter, wherein the controller receives the measurement result of the flow meter at a first cycle and when the measurement result of the flow meter indicates that the flow rate of the fluid flowing through the supply line is included in a preset range, adjusts the flow rate of the fluid flowing through the supply line by the flow rate adjustment mechanism at a second cycle having a time interval longer than a time interval of the first cycle.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

Figure 1:
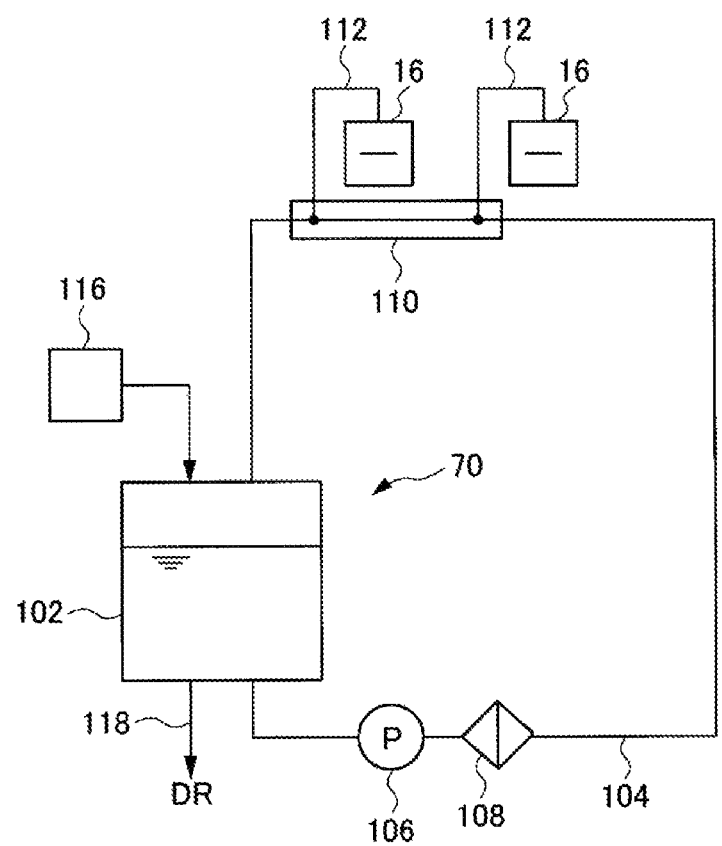
FIG. 1 is a view illustrating an outline of a liquid processing apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a technology capable of prolonging the life of a flow rate adjustment mechanism that adjusts a flow rate of a liquid to be supplied to a substrate.

An example of the present disclosure relates to a liquid processing apparatus that includes a substrate processing unit configured to supply a fluid to a substrate, a supply line configured to supply the fluid to the substrate processing unit, a flow meter configured to measure a flow rate of the fluid flowing through the supply line, a flow rate adjustment mechanism configured to adjust the flow rate of the fluid flowing through the supply line, and a controller configured to control the flow rate adjustment mechanism based on a measurement result of the flow meter, wherein the controller receives the measurement result of the flow meter at a first cycle and when the measurement result of the flow meter indicates that the flow rate of the fluid flowing through the supply line is included in a preset range, and the controller causes the flow rate adjustment mechanism to adjust the flow rate of the fluid flowing through the supply line at a second cycle having a time interval longer than a time interval of the first cycle.

In the above-described liquid processing apparatus, when the flow rate of the fluid flowing through the supply line as indicated by the measurement result of the flow meter is included in a preset first range determined based on a set flow rate, the controller causes the flow rate adjustment mechanism not to adjust the flow rate of the fluid flowing through the supply line, and when the flow rate of the fluid flowing through the supply line as indicated by the measurement result of the flow meter is included in a preset second range that is farther from the preset flow rate than the first range, the controller causes the flow rate adjustment mechanism to adjust the flow rate of the fluid flowing through the supply line at a second cycle having a time interval longer than a time interval of the first cycle.

In the above-described liquid processing apparatus, when the flow rate of the fluid flowing through the supply line as indicated by the measurement result of the flow meter is included in a preset second range determined based on a set flow rate, the controller causes the flow rate adjustment mechanism to adjust the flow rate of the fluid flowing through the supply line at a second cycle having a time interval longer than a time interval of the first cycle, and when the flow rate of the fluid flowing through the supply line as indicated by the measurement result of the flow meter is included in a preset third range that is farther from the preset flow rate than the second range, the controller causes the flow rate adjustment mechanism to adjust the flow rate of the fluid flowing through the supply line at a third cycle having a time interval shorter than a time interval of the second cycle.

In the above-described liquid processing apparatus, when the flow rate of the fluid flowing through the supply line as indicated by the measurement result of the flow meter is included in a preset third range that is farther from the preset flow rate than the second range, the controller causes the flow rate adjustment mechanism to adjust the flow rate of the fluid flowing through the supply line at a third cycle having a time interval shorter than a time interval of the second cycle.

In the above-described liquid processing apparatus, the time interval of the third cycle is equal to the time interval of the first cycle.

In the above-described liquid processing apparatus, the controller causes the flow rate adjustment mechanism to adjust the flow rate of the fluid flowing through the supply line substantially simultaneously with the timing of receiving the measurement result of the flow meter indicating that the flow rate of the fluid flowing through the supply line is included in the third range.

In the above-described liquid processing apparatus, the controller determines a timing of adjusting the flow rate adjustment mechanism based on a timing of receiving the measurement result of the flow meter indicating that the flow rate of the fluid flowing through the supply line is shifted from a state of not being included in the second range to a state of being included in the second range, and causes the flow rate adjustment mechanism not to adjust the flow rate of the fluid flowing through the supply line substantially simultaneously with at least the timing of receiving the measurement result.

In the above-described liquid processing apparatus, the controller causes the flow rate adjustment mechanism to adjust the flow rate of the fluid flowing through the supply line at least during a period in which an operation mode of the liquid processing apparatus is in a preset first operation mode, regardless of the measurement result of the flow meter, at a fourth cycle having a time interval shorter than the time interval of the second cycle.

In the above-described liquid processing apparatus, the time interval of the fourth cycle is equal to the time interval of the first cycle.

In the above-described liquid processing apparatus, the controller controls the flow rate adjustment mechanism based on the measurement result of the flow meter such that the flow rate of the fluid flowing through the supply line is close to a set flow rate.

Another aspect of the present disclosure relates to a liquid processing method that includes supplying a fluid to a substrate processing unit through a supply line and supplying the fluid from the substrate processing apparatus to a substrate, measuring a flow rate of the fluid flowing through the supply line by a flow meter, receiving, by a controller, a measurement result of the flow meter at a first cycle, and adjusting the flow rate of the fluid flowing through the supply line by a flow rate adjustment mechanism controlled by the controller, based on the measurement result of the flow meter, wherein, when the measurement result of the flow meter indicates that the flow rate of the fluid flowing through the supply line is included in a preset range, the flow rate of the fluid flowing through the supply line is adjusted by the flow rate adjustment mechanism at a cycle having a time interval longer than a time interval of the first cycle.

According to the present disclosure, the life of the flow rate adjustment mechanism may be prolonged.

Hereinafter, exemplary embodiments of the present disclosure will be described with reference to the accompanying drawings.

First, a typical example of a liquid processing apparatus to which the present disclosure is applicable will be described.

As illustrated in FIG. 1, the liquid processing apparatus has a plurality of processing units (liquid processing units) 16 that perform a liquid processing on the substrate and a processing fluid source 70 that supplies a processing liquid to the processing units 16.

The processing fluid source 70 includes a tank 102 that stores the processing liquid and a circulation line 104 that comes out of the tank 102 and returns back to the tank 102. A pump 106 is provided in the circulation line 104. The pump 106 forms a circulating flow that comes out of the tank 102 and returns back to the tank 102 through the circulation line 104. A filter 108 configured to remove contaminants such as particles included in the processing liquid is provided in the circulation line 104 at the downstream side of the pump 106. Auxiliary machinery (e.g., a heater) may be further provided in the circulation line 104 as needed.

One or more branch lines 112 are connected to a connection area 110 set in the circulation line 104. Each branch line 112 supplies the processing liquid flowing through the circulation line 104 to the processing unit 16 corresponding thereto. A flow rate adjustment mechanism such as, for example, a flow rate control valve, and a filter may be provided in each branch line 112 as needed.

The liquid processing apparatus has a tank liquid replenishment unit 116 that replenishes the processing liquid or a component of the processing liquid to the tank 102. A drain unit 118 is provided to the tank 102 so as to discard the processing liquid within the tank 102.

Figure 2:
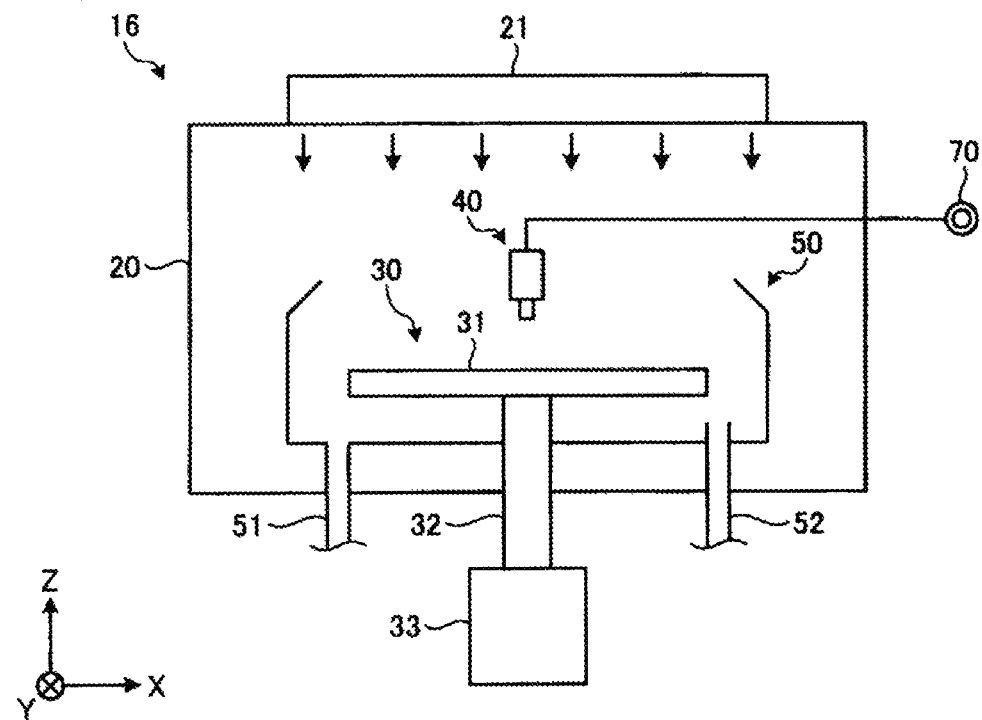
FIG. 2 is a vertical sectional view illustrating an outline of a processing unit.

Next, a typical example of the processing unit 16 will be described with reference to FIG. 2. In FIG. 2, in order to clarify positional relationships, an X-axis, a Y-axis, and a Z-axis which are orthogonal to each other will be defined. The positive Z-axis direction will be regarded as a vertically upward direction.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing liquid to the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

In the liquid processing apparatus of which the schematic configuration has been described above, for example, the processing unit 16 functions as a substrate processing unit that supplies the processing liquid to the wafer W, and the circulation line 104 and the branch line 112 function as supply lines that supply the processing liquid to the processing unit 16. The liquid processing apparatus of this exemplary embodiment also includes a flow meter configured to measure the flow rate of the processing liquid flowing through a supply line, a flow rate adjustment mechanism configured to adjust the flow rate of the processing liquid flowing through the supply line, and a controller configured to control the flow rate adjustment mechanism based on the measurement result of the flow meter. Hereinafter, a configuration example of a flow meter, a motor needle valve, and a controller in the case where the motor needle valve is used as a flow rate adjustment mechanism will be described.

Figure 3:
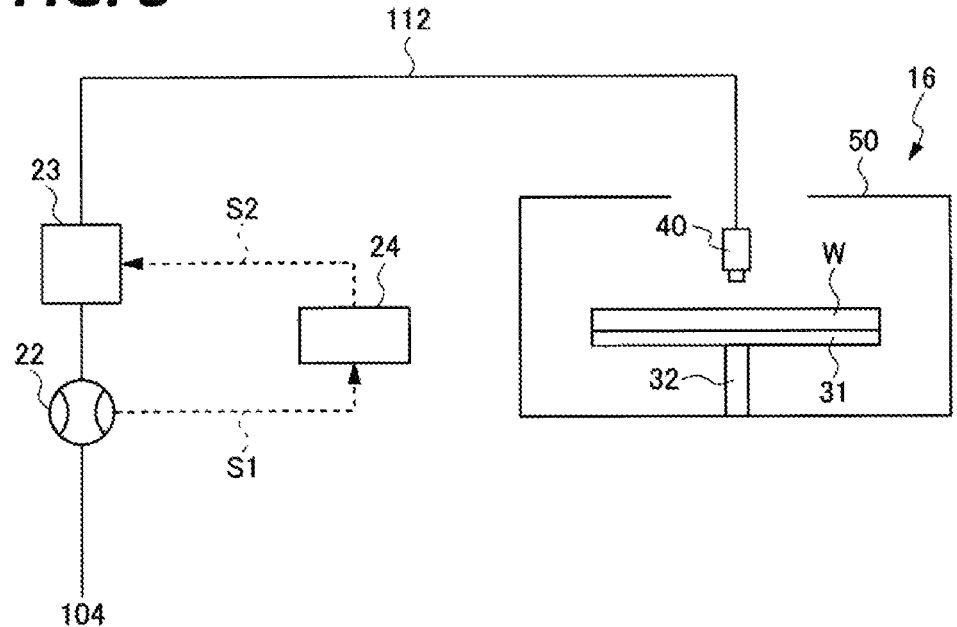
FIG. 3 is a schematic view illustrating a configuration example of a flow meter, a motor needle valve, and a controller.

FIG. 3 is a schematic diagram illustrating a configuration example of the flow meter 22, the motor needle valve 23, and the controller 24. FIG. 3 schematically illustrates some of the components constituting the processing unit 16.

In the exemplary embodiment illustrated in FIG. 3, the flow meter 22 and the motor needle valve 23 are provided in the branch line 112 which is connected to each processing fluid supply unit 40 and functions as a supply line. In FIG. 3, the flow meter 22 is disposed at the upstream side and the motor needle valve 23 is disposed at the downstream side. However, the flow meter 22 may be disposed at the downstream side and the motor needle valve 23 may be disposed at the upstream side.

The flow meter 22 measures the flow rate of the processing liquid flowing through the branch line 112 and sends a measurement signal S1 indicating the measurement result to the controller 24. Meanwhile, the motor needle valve 23 adjusts the flow rate of the processing liquid flowing through the branch line 112 based on a control signal S2 sent from the controller 24. Based on the measurement signal S1 from the flow meter 22, the controller 24 acquires information regarding the flow rate of the processing liquid flowing through the branch line 112 and acquires information regarding the driving amount of the motor needle valve 23 required for making the flow rate of the processing liquid be close to a preset flow rate, and based on the driving amount, the controller 24 sends the control signal S2 to the motor needle valve 23. The opening degree of the valve is adjusted by driving a motor of the motor needle valve 23 based on the control signal S2 from the controller 24, and the flow rate of the processing liquid flowing through the branch line 112 is increased or decreased by the motor needle valve 23.

By the flow meter 22, the motor needle valve 23, and the controller 24, the flow rate of the processing liquid flowing through the branch line 112 is adjusted to be close to the preset flow rate. Accordingly, a desired amount of the processing liquid is supplied from the processing fluid source 40 with respect to the wafer W which is held by the holding unit 31 and rotated by the support unit 32.

In the above-described liquid processing apparatus, in the method known in the related art, a flow rate measurement cycle of the flow meter 22 and a flow rate adjustment cycle of the motor needle valve 23 are equal to each other. That is, whenever receiving the measurement signal S1 from the flow meter 22, the controller 24 acquires information regarding the optimal opening degree of the motor needle valve 23 to send the control signal S2 to the motor needle valve 23 and adjusts the flow rate of the processing liquid based on the received control signal S2. According to the method known in the related art, the flow rate adjustment of the processing liquid is performed by the motor needle valve 23 at a relatively short cycle regardless of the measurement result of the flow meter 22. Therefore, in this method, since the flow rate of the processing liquid is adjusted at a short cycle, the number of operation times of the motor needle valve 23 increases necessarily and the life of the motor needle valve 23 is shortened.

In this regard, in this exemplary embodiment, when the measurement result of the flow meter 22 indicates that the flow rate of the processing liquid flowing through the branch line 112 is in a preset range, the flow rate adjustment by the motor needle valve 23 is performed at a time interval longer than the measurement interval of the flow meter 22. That is, the controller 24 receives a measurement signal S1 indicating the measurement result of the flow meter 22 at a first cycle P1 and monitors the flow rate of the processing liquid flowing through the branch line 112 at the first cycle P1. Meanwhile, when the measurement result of the flow meter 22 indicates that the flow rate of the processing liquid flowing through the branch line 112 is included in the preset range, the controller 24 controls the motor needle valve 23 to adjust the flow rate of the processing liquid flowing through the branch line 112 at a cycle having a time interval longer than the time interval of the first cycle P1 (i.e., a second cycle P2). The above-described phrase "the preset range of the flow rate of the processing liquid flowing through the branch line 112" in which the motor needle valve 23 is driven at the second cycle P2 indicates a range in which no adverse effect is expected to occur even when the flow rate of the processing liquid is adjusted at a time interval longer than the time interval of the flow meter 22. Therefore, a range relatively close to a preset flow rate may be set to "the preset range" mentioned here.

Figure 4:
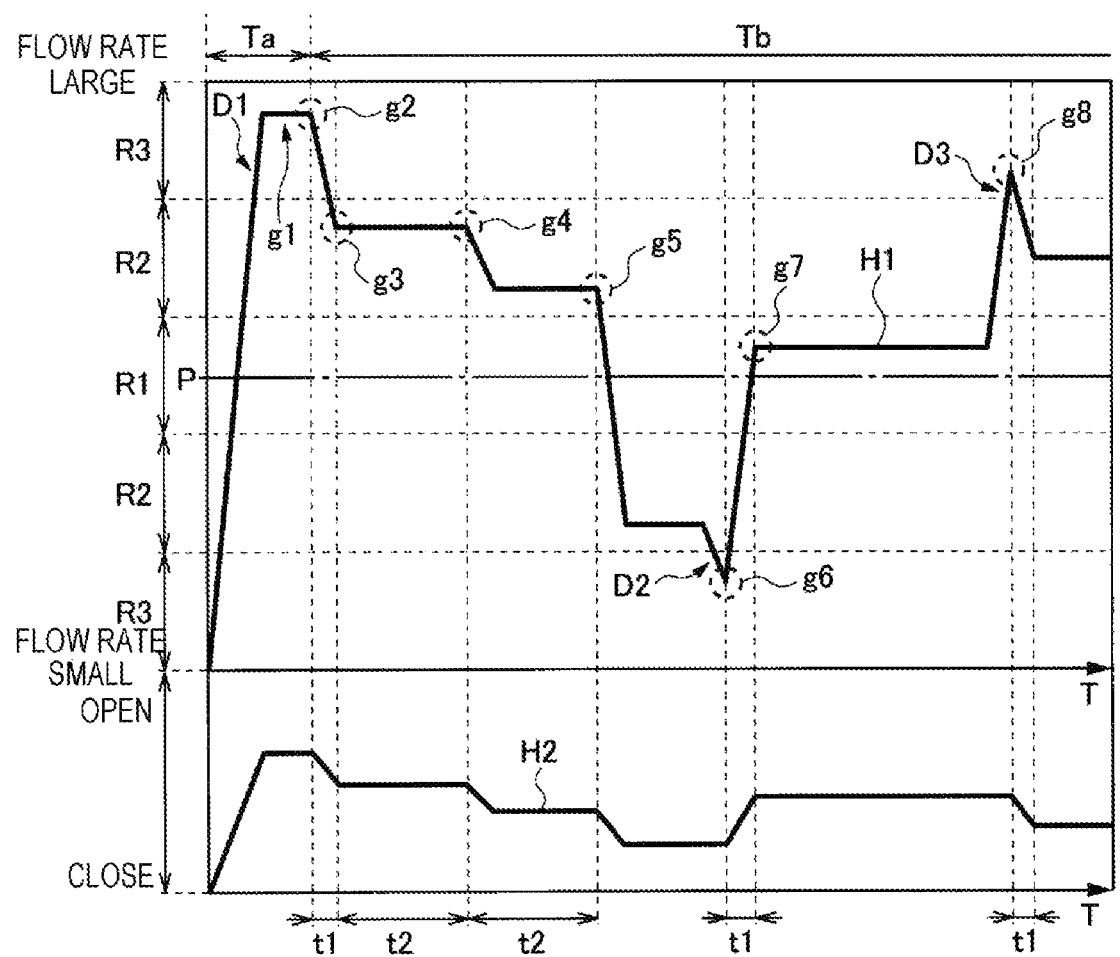
FIG. 4 is a graph illustrating an example of a relationship between the flow rate of a processing liquid flowing through a branch line and the opening degree of the motor needle valve with respect to the elapse of time T, in which the behavior of the flow rate of the processing liquid and the behavior of the opening degree of the motor needle valve correspond to each other.

FIG. 4 is a graph illustrating an example of a relationship between a flow rate H1 of a processing liquid flowing through the branch line 112 and the opening degree H2 of the motor needle valve 23 with respect to the elapse of time T, in which the behavior of the flow rate H1 of the processing liquid and the behavior of the opening degree H2 of the motor needle valve are associated with each other. In FIG. 4, the horizontal direction indicates the elapse of the time T. Further, the ranges indicated by symbols "t1," "t2," and the like in FIG. 4 are not necessarily represented by a strictly correct scale ratio, and the ranges indicated by various symbols are schematically illustrated for ease of understanding. Further, regarding the flow rate H1 of the processing liquid, the vertical direction of FIG. 4 indicates the magnitude of the flow rate, in which the flow rate becomes larger toward the upper side and becomes smaller toward the lower side. In addition, regarding the opening degree H2 of the motor needle valve 23, the vertical direction of FIG. 4 indicates the opening degree, in which the cross-sectional area of the flow passage becomes larger toward the upper side as the motor needle valve 23 is opened and the cross-sectional area of the flow passage becomes smaller toward the lower side as the motor needle valve 23 is closed.

In the exemplary embodiment illustrated in FIG. 4, an initial valve opening processing Ta is first performed and then a usual feedback processing Tb is performed.

The initial valve opening processing Ta is a processing in which the motor needle valve 23 is opened and the processing liquid is made to flow from the branch line 112 to the processing liquid supply unit 40 from a state in which the motor needle valve 23 is fully closed and the processing liquid does not flow from the branch line 112 to the processing fluid supply unit 40. In the initial valve opening processing Ta, the opening degree of the motor needle valve 23 is fixed to a preset opening degree. Further, the initial valve opening processing Ta is not an essential processing and may be omitted as needed. In that case, the usual feedback processing Tb to be described later may be performed from the beginning.

Meanwhile, the usual feedback processing Tb is a processing in which the flow rate of the processing liquid from the branch line 112 to the processing fluid supply unit 40 is adjusted according to the measurement result of the flow meter 22. In the usual feedback processing Tb, the controller 24 controls the motor needle valve 23, based on the measurement result of the flow meter 22, so that the flow rate of the processing liquid flowing through the branch line 112 is close to a set flow rate P. Therefore, the usual feedback processing Tb further includes steps of measuring the flow rate of the processing liquid by the flow meter 22 and adjusting the flow rate of the processing liquid by the motor needle valve 23 in addition to steps of supplying the processing liquid to the processing fluid supply unit 40 through the branch line 112 and supplying the processing liquid from the processing fluid supply unit 40 to the wafer W.

In the usual feedback processing Tb of this exemplary embodiment, the opening degree of the motor needle valve 23 and the flow rate of the processing liquid are specifically adjusted as described below.

In the exemplary embodiment illustrated in FIG. 4, a first range R1, a second range R2, and a third range R3 are set with respect to the flow rate of the processing liquid flowing through the branch line 112. The first range R1 is preset based on the set flow rate P, includes the set flow rate P, and is closer to the set flow rate P than the second range R2 and the third range R3. Meanwhile, the second range R2 is a preset range that is farther from the set flow rate P than the first range R1, and is closer to the set flow rate P than the third range R3. Further, the third range R3 is a preset range that is farther from the set flow rate P than the second range R2, and for example, the third range R3 includes a state in which the flow rate of the processing liquid when the processing liquid does not flow through the branch line 112, that is, the flow rate of the processing liquid is zero (0).

In addition, the first range R1 and the second range R2 mentioned herein refer to the ranges that are allowable when properly performing a liquid processing on the wafer W using the processing liquid, whereas the third range R3 refers to the range that is not allowable when properly performing a liquid processing on the wafer W using the processing liquid.

As described above, upon comparing the first range R1 to the third range R3, the first range R1 indicates a state in which the processing liquid having the flow rate in a range closest to the preset flow rate P flows through the branch line 112, and the third range R3 indicates a state in which the processing liquid having the flow rate in a range farthest to the preset flow rate P flows through the branch line 112. Also, the second range R2 indicates a state in which the processing liquid having the flow rate in an intermediate range flows through the branch line 112. Therefore, when the flow rate of the processing liquid flowing through the branch line 112 is included in the first range R1, since the flow rate of the processing liquid is close to the set flow rate P, the urgency of the flow rate adjustment of the processing liquid is relatively low. Meanwhile, when the flow rate of the processing liquid flowing through the branch line 112 is included in the third range R3, since the flow rate of the processing liquid is far from the set flow rate P, the urgency of the flow rate adjustment of the processing liquid is relatively high. Further, when the flow rate of the processing liquid flowing through the branch line 112 is included in the second range R2, the urgency of the flow rate adjustment of the processing liquid is intermediate. As described above, the urgency of the flow rate adjustment of the processing liquid flowing through the branch line 112 increases in the order of the first range R1, the second range R2, and the third range R3.

The controller 24 of this exemplary embodiment changes the frequency of the flow rate adjustment by the motor needle valve 23 according to the urgency of the flow rate adjustment of the processing liquid. Accordingly, the number of times of the operation by the motor needle valve 23 is attempted to be reduced. That is, the controller 24 changes the operation cycle of the motor needle valve 23 according to whether the flow rate of the processing liquid flowing through the branch line 112 as indicated by the measurement result of the flow meter 22 is included in the first range R1, the second range R2, or the third range R3.

For example, when the flow rate of the processing liquid flowing through the branch line 112 as indicated by the measurement result of the flow meter 22 is included in the first range R1, the controller 24 controls the motor needle valve 23 not to adjust the flow rate of the processing liquid flowing through the branch line 112. Further, when the flow rate of the processing liquid flowing through the branch line 112 as indicated by the measurement result of the flow meter 22 is included in the second range R2, the controller 24 controls the motor needle valve 23 to adjust the flow rate of the processing liquid flowing through the branch line 112 at the above-described second cycle P2. Further, when the flow rate of the processing liquid flowing through the branch line 112 as indicated by the measurement result of the flow meter 22 is included in the third range R3, the controller 24 controls the motor needle valve 23 to adjust the flow rate of the processing liquid flowing through the branch line 112 at a third cycle P3 having a time interval shorter than the time interval of the second cycle P2. In particular, in this exemplary embodiment, the time interval of the third cycle P3 is equal to the time interval of the first cycle P1. Therefore, when the flow rate of the processing liquid flowing through the branch line 112 is included in the third range R3, the motor needle valve 23 adjusts the flow rate of the processing liquid flowing through the branch line 112 at the first cycle P1.

Next, the behavior of the flow rate H1 of the processing liquid flowing through the branch line 112 and the behavior of the opening degree H2 of the motor needle valve 23 as illustrated in FIG. 4 will be described specifically.

First, the initial valve opening processing Ta is performed and the motor needle valve 23 is opened from a fully closed state to a preset opening degree. As a result, the flow rate of the processing liquid flowing from the branch line 112 toward the processing fluid supply unit 40 rapidly increases, and in the example illustrated in FIG. 4, the flow rate of the processing liquid increases up to the third range R3 (see symbol "g1" in FIG. 4).

In the initial valve opening processing Ta, the flow meter 22 performs a flow rate measurement of the processing liquid at the first cycle P1, whereas the motor needle valve 23 does not periodically perform a flow rate adjustment of the processing liquid. That is, in the initial valve opening processing Ta, the feedback control of the motor needle valve 23 is not performed, and the opening degree of the motor needle valve 23 is fixed to the preset opening degree regardless of the measurement result of the flow meter 22.

Further, once the initial valve opening processing Ta ends and the usual feedback processing Tb is started, the feedback control of the motor needle valve 23 is performed and the flow rate adjustment of the processing liquid is performed according to the flow rate of the processing liquid.

In the example illustrated in FIG. 4, when the initial valve opening processing Ta ends and the usual feedback processing Tb is started, the flow rate H1 of the processing liquid flowing through the branch line 112 is in the third range R3. Therefore, as described above, the controller 24 controls the motor needle valve 23 to adjust the flow rate of the processing liquid flowing through the branch line 112 at the first cycle P1 so as to make the flow rate of the processing liquid be close to the set flow rate P. Specifically, the motor needle valve 23 decreases the opening degree according to the control signal S2 from the controller 24 so as to narrow the flow passage and reduce the flow rate of the processing liquid flowing through the branch line 112.

In particular, the controller 24 of this exemplary embodiment adjusts the flow rate of the processing liquid flowing through the branch line 112 by the motor needle valve 23 substantially simultaneously with the timing of receiving the measurement result of the flow meter 22 indicating that the flow rate of the processing liquid flowing through the branch line 112 is included in the third range R3. In the example illustrated in FIG. 4, when the usual feedback processing Tb is started, the flow rate of the processing liquid flowing through the branch line 112 is included in the third range R3. For this reason, the controller 24 sends the control signal S2 to the motor needle valve 23 substantially simultaneously with the timing of receiving the measurement signal S1 from the flow meter 22 immediately after the usual feedback processing Tb is started, and reduces the flow rate of the processing liquid flowing through the branch line 112 (see symbol "g2" in FIG. 4).

In addition, the phrase "substantially simultaneously" used herein means that it is not necessary to be strictly simultaneous. The time required from the reception of the measurement signal S1 in the controller 24 to the transmission of the control signal S2 and the time required from the reception of the control signal S2 in the motor needle valve 23 to the valve driving are actually very short time. Therefore, even when there is a certain delay between "the timing at which the controller 24 receives the measurement result of the flow meter 22" and "the timing at which the flow rate adjustment is performed by the motor needle valve 23," such a delay is a short time that is substantially negligible. Therefore, it can be stated that "the reception of the measurement result of the flow meter 22 by the controller 24" and "the flow rate adjustment by the motor needle valve 23" are performed substantially simultaneously.

In the example illustrated in FIG. 4, the flow rate of the processing liquid flowing through the branch line 112 is changed from the third range R3 (see symbol "g2" in FIG. 4) to the second range R2 (see symbol "g3" in FIG. 4) by the initial flow rate adjustment of the motor needle valve 23 in the above-described usual feedback processing Tb. Therefore, the controller 24 adjusts the flow rate of the processing liquid flowing through the branch line 112 at the above-described first cycle P2 by the motor needle valve 23 so as to make the flow rate of the processing liquid close to the set flow rate P. That is, the controller 24 receives the measurement signal S1 from the flow meter 22 at the first cycle P1, while transmitting the control signal S2 to the motor needle valve 23 at the second cycle P2.

In particular, the controller 24 in this exemplary embodiment determines the timing at which the motor needle valve 23 adjusts the flow rate of the processing liquid based on the timing of receiving the measurement result of the flow meter 22 indicating that the flow rate of the processing liquid flowing through the branch line 112 is shifted from a state of not being included in the second range R2 to a state of being included in the second range R2 (see symbol "g3"). Further, the controller 24 does not adjust the flow rate of the processing liquid flowing through the branch line 112 by the motor needle valve 23 substantially simultaneously with at least the timing of receiving the same measurement result as described above.

Figure 5:
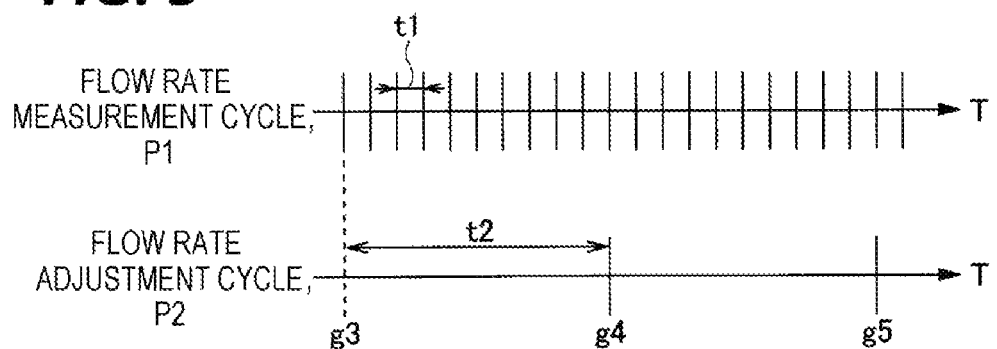
FIG. 5 is a view illustrating an example of a relationship between a flow rate measurement cycle by the flow meter (i.e., a first cycle) and a flow rate adjustment cycle by the motor needle valve (i.e., a second cycle).

FIG. 5 is a diagram illustrating an example of a relationship between a flow rate measurement cycle by the flow meter 22 (i.e., a first cycle P1) and a flow rate adjustment cycle by the motor needle valve 23 (i.e., a second cycle P2). In FIG. 5, the horizontal direction indicates the elapse of time T, and the solid line extending in the vertical direction illustrates the flow rate measurement timing by the flow meter 22 and the flow rate adjustment timing by the motor needle valve 23. Further, in FIG. 5, symbol "t1" indicates the time interval of the first cycle P1, symbol "t2" indicates the time interval of the second cycle P2, and the same applies to symbols "t1" and "t2" illustrated in FIG. 4.

As illustrated in FIG. 5, in this exemplary embodiment, at the timing at which the controller 24 receives the measurement result of the flow meter 22 indicating that the flow rate of the processing liquid is shifted from a state of not being included in the second range R2 to a state of being included in the second range R2 (see symbol "g3"), the flow rate adjustment of the processing liquid is not performed. Meanwhile, the timing at which the flow rate adjustment of the processing liquid is performed by the motor needle valve 23 is determined based on the timing at which the controller 24 receives the above-described measurement result. That is, the timing at which the controller 24 receives the above-described measurement result is a starting point of the second cycle P2, and the timing at which the flow rate adjustment by the motor needle valve 23 is performed next is set after time t2 from the starting point. Therefore, even when the controller 24 detects that the flow rate of the processing liquid flowing through the branch line 112 has shifted from a state of being not included in the second range R2 to a state of being included in the second range R2, the flow rate adjustment of the processing liquid by the motor needle valve 23 is not performed at the detected timing. However, after time t2 from the detected timing, the flow rate adjustment of the processing liquid by the motor needle valve 23 is performed, and the flow rate of the processing liquid flowing through the branch line 112 is made to be close to the set flow rate P.

By operating the motor needle valve 23 at a cycle (i.e., the second cycle P2) longer than the measurement cycle by the flow meter 22 (i.e., the first cycle P1) in this way, the number of times of the operation of the motor needle valve 23 may be effectively reduced. That is, compared to the method known in the related art in which the flow rate measurement cycle of the flow meter 22 and the flow rate adjustment cycle of the motor needle valve 23 are equal to each other, in the control method of this exemplary embodiment, since the flow rate adjustment cycle of the motor needle valve 23 is longer than the flow rate measurement cycle of the flow meter 22, the flow rate adjustment frequency is suppressed and the number of times of the operation of the motor needle valve is reduced. For example, since the relationship of "t2=t1×10" is satisfied in FIG. 5, the number of times of the operation of the motor needle valve 23 while the flow rate of the processing liquid is in the second range R2 becomes one tenth (i.e., 1/10) compared to the method known in the related art. Further, in particular, by not operating the motor needle valve 23 substantially simultaneously with the timing at which the controller 24 receives the measurement result of the flow meter 22 indicating that the flow rate of the processing liquid has shifted from a state of not being included in the second range R2 to a state of being included in the second range R2, the number of times of the operation of the motor needle valve 23 may be reduced more effectively.

Further, as illustrated in FIG. 5, in this exemplary embodiment, the flow rate measurement of the processing liquid by the flow meter 22 is performed substantially simultaneously with the timing of the flow rate adjustment of the processing liquid by the motor needle valve 23, but the timing of the flow rate measurement by the flow meter 22 and the timing of the flow rate adjustment by the motor needle valve 23 may be deviated from each other.

In addition, as illustrated in FIG. 4, while the measurement result of the flow meter 22 indicates that the flow rate of the processing liquid flowing through the branch line 112 is in the second range R2, the opening degree adjustment of the motor needle valve 23 is repeatedly performed at the second cycle P2 and the flow rate of the processing liquid becomes close to the set flow rate P (see symbols "g4" and "g5").

Thereafter, in the example illustrated in FIG. 4, the controller 24 detects from the measurement result of the flow meter 22 that the flow rate of the processing liquid flowing through the branch line 112 becomes excessively smaller and is in the third range R3 (see symbol "g6"). Therefore, as described above, the controller 24 adjusts the flow rate of the processing liquid by the motor needle valve 23 substantially simultaneously with the timing at which the above-described measurement result is received. Specifically, the motor needle valve 23 is opened and the flow rate of the processing liquid flowing through the branch line 112 increases so as to be close to the set flow rate P.

As described above, as soon as it is detected that the flow rate of the processing liquid flowing through the branch line 112 is in the third range R3, the flow rate of the processing liquid is adjusted by operating the motor needle valve, thereby promptly preventing the flow rate of the processing liquid from excessively deviating from the set flow rate P.

Thereafter, in the example illustrated in FIG. 4, the measurement result of the flow meter 22 indicates that the flow rate of the processing liquid flowing through the branch line 112 is in the first range R1 (see symbol "g7"). As described above, while the flow rate of the processing liquid flowing through the branch line 112 is in the first range R1, the flow rate adjustment of the processing liquid by the motor needle valve 23 is not performed, and the motor needle valve 23 is not substantially operated while maintaining the opening degree. However, when the flow rate of the processing liquid flowing through the branch line 112 is in the first range R1, the measurement and the transmission of the measurement signal S1 by the flow meter 22 are continuously performed, and the controller 24 keeps monitoring the flow rate of the processing liquid flowing through the branch line 112 at the first cycle P1.

Thereafter, in the example illustrated in FIG. 4, the controller 24 detects again, from the measurement result of the flow meter 22, that the flow rate of the processing liquid flowing through the branch line 112 becomes excessively larger and is in the third range R3 (see symbol "g8"). Therefore, as described above, the controller 24 makes the flow rate of the processing liquid flowing through the branch line 112 close to the set flow rate P by adjusting the flow rate of the processing liquid by the motor needle valve 23 substantially simultaneously with the timing of receiving the above-described measurement result.

As described above, based on the measurement result of the flow meter 22, the controller 24 adjusts the flow rate adjustment cycle of the motor needle valve 23 depending on within which range (i.e., one of the first range R1 to the third range R3 which are indexes of deviation from the set flow rate P) the flow rate of the processing liquid flowing through the branch line 112 falls. While the flow rate of the processing liquid falls within the first range R1, the opening/closing operation of the motor needle valve 23 is not performed and the number of times of the operation of the motor needle valve 23 is attempted to be reduced. Meanwhile, the flow rate of the processing liquid falls within the third range R3, the opening/closing operation of the motor needle valve 23 is performed at a relatively short cycle so as to promote rapid optimization of the flow rate of the processing liquid. Further, while the flow rate of the processing liquid falls within the second range R2, the opening/closing operation of the motor needle valve 23 is performed at a relatively long cycle so as to promote reduction of the number of times of the operation of the motor needle valve 23 and optimization of the flow rate of the processing liquid.

Figure 6:
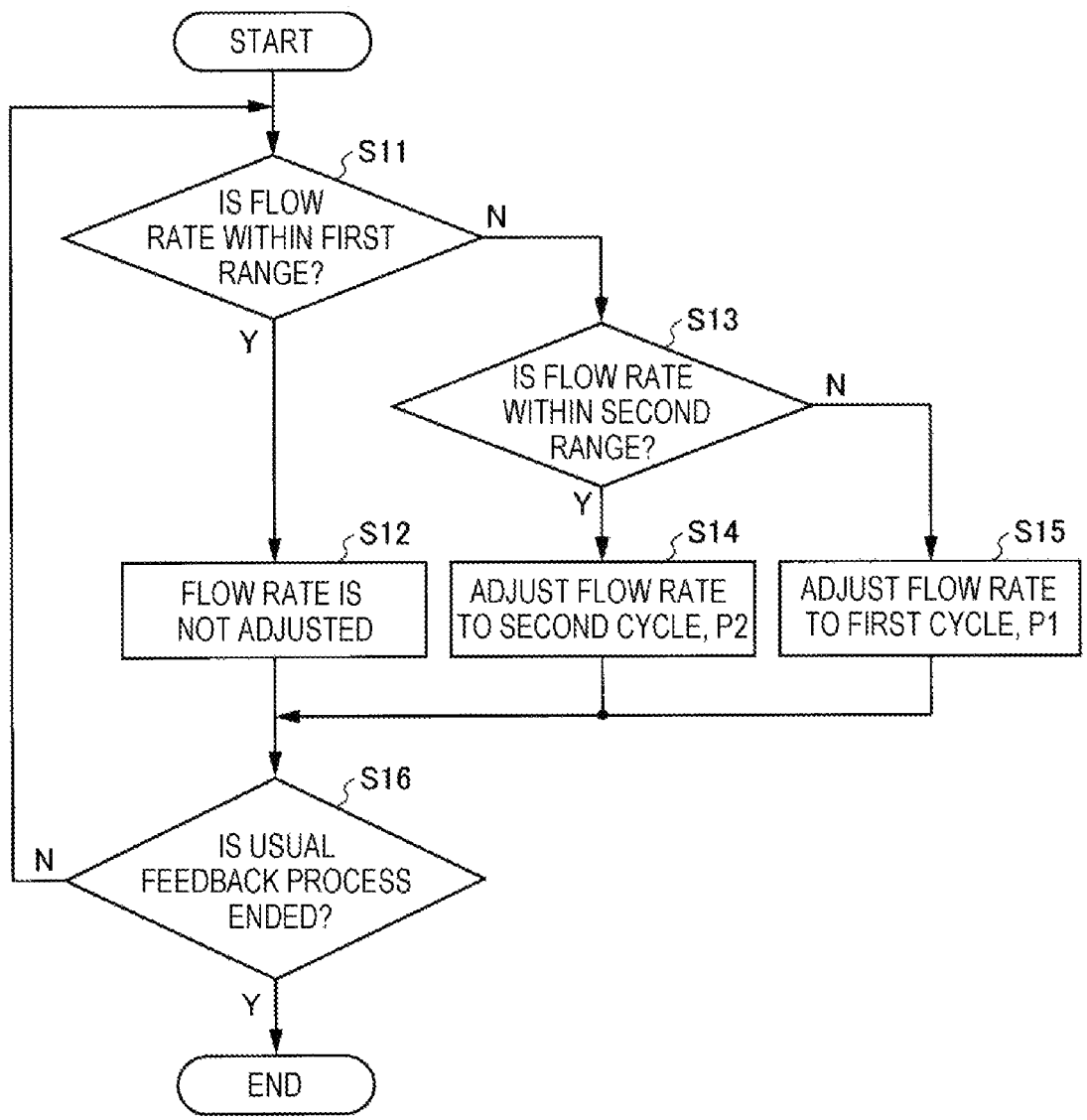
FIG. 6 is a view illustrating a flow for determining the flow rate adjustment cycle of the motor needle valve in a usual feedback processing.

FIG. 6 is a diagram illustrating a flow that determines the flow rate adjustment cycle of the motor needle valve 23 in the usual feedback processing Tb.

In the processing flow illustrated in FIG. 6, the controller 24 first determines whether the flow rate of the processing liquid flowing through the branch line 112 is in the first range R1 (see S11 in FIG. 6). Specifically, the controller 24 acquires information regarding the flow rate of the processing liquid flowing through the branch line 112 based on the measurement signal S1 from the flow meter 22 and, based on the information, determines whether the flow rate of the processing liquid is in the first range R1.

When it is determined that the flow rate of the processing liquid flowing through the branch line 112 is in the first range R1 ("Y" in S11), the controller 24 does not perform the flow rate adjustment of the processing liquid by the motor needle valve 23. For example, the transmission of the control signal S2 from the controller 24 to the motor needle valve 23 may be stopped so that the flow rate adjustment of the processing liquid by the motor needle valve 23 is not performed, although a specific method is not particularly limited.

Meanwhile, when it is determined that the flow rate of the processing liquid flowing through the branch line 112 is not in the first range R1 ("N" in S11), the controller 24 determines whether the flow rate of the processing liquid flowing through the branch line 112 is in the second range R2 (S13). When it is determined that the flow rate of the processing liquid flowing through the branch line 112 is in the second range R2 ("Y" in S13), the controller 24 performs the flow rate adjustment of the processing liquid by the motor needle valve 23 at the second cycle P2 (S14). Specifically, the flow rate adjustment of the processing liquid by the motor needle valve 23 may be performed at the second cycle P2 by sending the control signal S2 from the controller 24 to the motor needle valve 23 at the second cycle P2.

Meanwhile, when it is determined that the flow rate of the processing liquid flowing through the branch line 112 is not in the second range R2 ("N" in S13), since the flow rate of the processing liquid flowing through the branch line 112 is in the third range R3, the controller 24 performs the flow rate adjustment of the processing liquid by the motor needle valve 23 at the first cycle P1 (S15). Specifically, the flow rate adjustment of the processing liquid by the motor needle valve 23 may be performed at the first cycle P1 by sending the control signal S2 from the controller 24 to the motor needle valve 23 at the first cycle P1.

Then, the controller 24 repeats the above-described processing steps S11 to S15 until the end of the usual feedback processing Tb ("N" in S16) and ends the processing flow illustrated in FIG. 6 due to the end of the usual feedback processing Tb ("Y" in S16). Further, the controller 24 may determine the end of the usual feedback processing Tb by an arbitrary method. For example, when a signal indicating the end of the usual feedback processing is input to the controller 24, the controller 24 may determine the end of the usual feedback processing Tb based on such a signal. In addition, when the timing of the end of the usual feedback processing Tb is determined in advance, the controller 24 may determine the end of the usual feedback processing Tb based on the timing.

As described above, according to the liquid processing apparatus and the liquid processing method of this exemplary embodiment, by adjusting the flow rate of the processing liquid flowing through the branch line 112 according to the urgency, the flow rate of the processing liquid may be prevented from excessively deviating from the set flow rate P while the number of times of the operation of the motor needle valve 23 may be effectively reduced. That is, when the flow rate of the processing liquid is in the third range R3 in which the urgency is high, priority is given to the reduction of the deviation from the set flow rate P, and the flow rate of the processing liquid by the motor needle valve 23 is adjusted simultaneously with the measurement timing of the flow meter 22 so as to make the flow rate of the processing liquid be close to the set flow rate P quickly. Meanwhile, when there is a flow rate of the processing liquid in the second range R2 in which the urgency is not so high, the flow rate adjustment of the processing liquid by the motor needle valve 23 is performed at a time interval longer than that in the measurement cycle of the flow meter 22 so as to prevent the deviation from the set flow rate P and reduce the number of times of the operation of the motor needle valve 23. Further, when the flow rate of the processing liquid is in the first range R1 in which the urgency is not high, the flow rate of the processing liquid by the motor needle valve is not performed, and the number of times of the operation of the motor needle valve 23 may be further reduced.

For example, even in the above-described case where it is necessary to operate the motor needle valve 23 many times such as 150,000,000 times in 10 years in the method known in the related art, according to the above-described exemplary embodiment, the number of times of the operation of the motor needle valve 23 may be reduced to about 20,000,000 times in 10 years. That is, according to the liquid processing method and the liquid processing apparatus of this exemplary embodiment, since the number of times of the operation of the motor needle valve 23 may be reduced to one seventh (1/7) compared to the method known the related art, the life of the motor needle valve 23 may be drastically prolonged.

Meanwhile, the controller 24 receives the measurement signal S1 from the flow meter 22 at a very short time interval regardless of the urgency of the flow rate adjustment of the processing liquid and keeps monitoring the flow rate of the processing liquid flowing through the branch line 112. Therefore, even when the flow rate of the processing liquid flowing through the branch line 112 becomes excessively large or small due to a certain factor, the controller 24 promptly detects the change in the flow rate of the processing liquid and controls the motor needle valve 23 so as to adjust the flow rate of the processing liquid to be close to the set flow rate P quickly.

Further, since the factors causing abnormality in the flow rate of the processing liquid are based on various phenomena, the flow rate of the processing liquid may be disturbed by the factors of which the generation timing is predictable and the sudden factors of which the generation timing is unpredictable. For example, as indicated by symbol "D1" in FIG. 4, in the initial valve opening processing Ta in which the motor needle valve 23 is opened to the preset opening degree from the closed state, the processing liquid having the flow rate which is far from the set flow rate P is likely to flow through the branch line 112. Further, as illustrated in FIG. 1, when a plurality of processing units 16 are connected to one tank 102, the liquid processing step of each of the processing units 16 is influenced by the operating state of the other processing unit 16. Therefore, for example, once the liquid processing step of the other processing unit 16 is started during the liquid processing step of a certain processing unit 16, the supply amount of the processing liquid to the certain processing unit 16 decreases, and the flow rate of the processing liquid may be reduced as illustrated as symbol "D1" in FIG. 4. Further, although not illustrated in the drawings, a plurality of tanks 102 are connected to one processing unit 16, and when the processing liquid source to the processing unit 16 switches from an empty tank 102 to another full tank 102, the flow rate of the processing liquid may suddenly increase as illustrated as symbol "D3" in FIG. 4. According to the liquid processing method and the liquid processing apparatus of this exemplary embodiment, even when the amount of the processing liquid may be disturbed due to the above-described predictable factors and unpredictable factors, the flow rate of the processing liquid may be quickly adjusted to be close to the set flow rate P.

In addition, the present disclosure is not limited to the above-described exemplary embodiments and modified examples, various aspects that one of ordinary skill in the art could conceive by adding various modifications may be included in the scope of the present disclosure, and the effects to be exhibited by the present disclosure are not limited to the above-described matters. Therefore, various additions, modifications, and partial deletions may be made to the elements described in the specification and claims without departing from the technical idea and gist of the present disclosure.

For example, the above-described first range R1, second range R2, and third range R3 are not necessarily fixed and may be set variably accordingly to the characteristics of the processing liquid to be measured and adjusted for the flow rate, the characteristics of the wafer W, the required flow rate adjustment precision, or the like. Further, the above-described first range R1, second rage R3, and third range R4 may be set to be variable in one liquid processing step (in particular, the usual feedback processing Tb).

Figure 7:
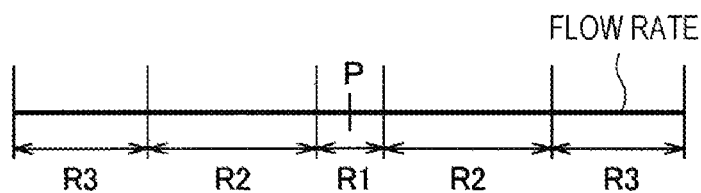
FIG. 7 is a conceptual view illustrating an example of a relationship among the sizes of a first range, a second range, and a third range.
Figure 8:
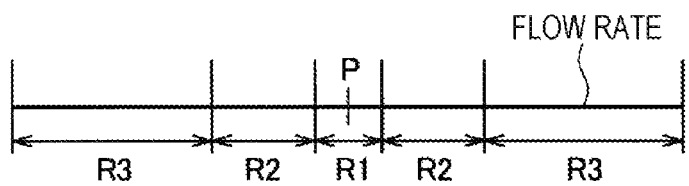
FIG. 8 is a conceptual view illustrating another example of the relationship among the sizes of the first range, the second range, and the third range.

FIG. 7 is a conceptual diagram illustrating an example of a relationship among the sizes of the first range R1, the second range R2, and the third range R3. FIG. 8 is a conceptual diagram illustrating another example of a relationship among the sizes of the first range R1, the second range R2, and the third range R3. In FIGS. 7 and 8, the abscissa indicates the flow rate of the processing liquid flowing through the branch line 112, and symbol "P" indicates the set flow rate, the fact that the flow rate becomes smaller as the arrow goes to the left side than "P," and the fact that the flow rate of the processing liquid becomes larger as the arrows goes to the right side than "P."

As described above, the flow rate adjustment of the processing liquid is not performed in the first range R1, the flow rate adjustment of the processing liquid is performed at the second cycle P2 of a time interval longer than the first cycle P1 in the second range R2, and the flow rate adjustment of the processing liquid is performed at the first cycle P1 in the third range R3. Therefore, as the range occupied by the third range R3 becomes larger, the number of times of the operation of the motor needle valve 23 increases, and as the ranges occupied by the first range R1 and the second range R2 (in particular, the first range R1) become larger, the number of times of the operation of the motor needle valve 23 tends to decrease. Meanwhile, as the ranges occupied by the second range R2 and the third range R3 (in particular, the third range R3) become larger, the possibility that the flow rate of the processing liquid flowing through the branch line 112 may deviate from the set flow rate P may be reduced. Also, as the range occupied by the first range R1 increases, the possibility that the flow rate of the processing liquid may deviate from the set flow rate P increases.

Therefore, for example, when it is required to reduce the number of times of the operation of the motor needle valve 23 and to precisely adjust the flow rate of the processing liquid in a well-balanced manner, the second range R2 may be made to be relatively broad and the third range R3 may be made to be relatively narrow, as illustrated in FIG. 7. Meanwhile, when the priority of reducing the number of times of the operation of the motor needle valve 23 is higher than that of precisely adjusting the flow rate of the processing liquid, the second range R2 may be made to be relatively narrow and the third range R3 relatively broad or the first range R1 may be made to be relatively narrow, as illustrated in FIG. 8. Further, when the priority of reducing the number of times of the operation of the motor needle valve 23 is higher than that of precisely adjusting the flow rate of the processing liquid, the first range R1 and/or the second range R2 may be made to be relatively broad and the third range R3 may be made to be relatively narrow.

Further, in the above-described exemplary embodiment, the range of the flow rate of the processing liquid flowing through the branch line 112 is divided into three, but the range may be divided into two or four or more.

Figure 9:
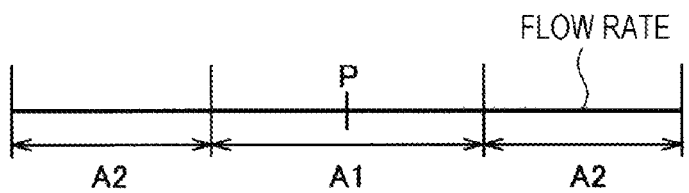
FIG. 9 is a conceptual view illustrating an example of a relationship between the sizes of the first range and the second range when the range of the flow rate of the processing liquid is divided into two.

FIG. 9 is a conceptual diagram illustrating an example of the relationship between the sizes of the first section range A1 and the second section range A2 when the range of the flow rate of the processing liquid is divided into two. In FIG. 9, the horizontal axis indicates the flow rate of the processing liquid flowing through the branch line 112, and symbol "P" indicates the set flow rate. FIG. 9 represents that the flow rate becomes smaller toward the left side from "P," and the flow rate of the processing liquid becomes larger toward the right side from "P."

As illustrated in FIG. 9, in the case where the range of the flow rate of the processing liquid is divided into the first section range A1 and the second section range A2, when the flow rate of the processing liquid flowing through the branch line 112 is in the preset first section range A1 that is relatively close to the set flow rate P, the time interval of the flow rate adjustment cycle of the motor needle valve 23 may be set to be relatively long. Meanwhile, when the flow rate of the processing liquid flowing through the branch line 112 is in the preset second section range A2 that is farther from the set flow rate P than the first section range A1, the time interval of the flow rate adjustment cycle of the motor needle valve 23 may be set to be relatively short. Accordingly, the reduction of the number of times of the operation of the motor needle valve 23 and the precise control of the flow rate of the processing liquid may be performed in a well-balanced manner.

Further, one of the above-described first range R1, second range R2, and third range R3 may be allocated to the above-described first section range A1 and second section range A2 which are determined based on the set flow rate P. That is, it is possible to set the first section range A1 as the first range R1 and the second section range A2 as the second range R2, set the first section range A1 as the first range R1 and the second section range A2 as the third range R3, or set the first section range A1 as the second range R2 and the second section range A2 as the third range R3.

For example, when the first section range A1 is set as the first range R1 and the second section range A2 is set as the second range R2, the controller 24 adjusts the flow rate of the processing liquid flowing through the branch line 112 as described below. That is, when the flow rate of the processing liquid flowing the branch line 112 as indicated by the measurement result of the flow meter 22 is included in the first section range A1 (i.e., the first range R1), the controller 24 controls the flow rate of the processing liquid flowing through the branch line 112 not to be adjusted by the motor needle valve 23. Meanwhile, when the flow rate of the processing liquid flowing through the branch line 112 as indicated by the measurement result of the flow meter 22 is included in the second section range A2 (i.e., the second range R2), the controller 24 adjusts the flow rate of the processing liquid flowing through the branch line 112 by the motor needle valve 23 at the above-described second cycle P2.

Further, when the first section range A1 is set as the first range R1 and the second section range A2 is set as the third range R3, the controller 24 adjusts the flow rate of the processing liquid flowing through the branch line 112 as described below. That is, when the flow rate of the processing liquid flowing through the branch line 112 as indicated by the measurement result of the flow meter 22 is included in the first section range A1 (i.e., the first range R1), the controller 24 controls the flow rate of the processing liquid flowing through the branch line 112 not to be adjusted by the motor needle valve 23. Meanwhile, when the flow rate of the processing liquid flowing through the branch line 112 as indicated by the measurement result of the flow meter 22 is included in the second section range A2 (i.e., the third range R3), the controller 24 adjusts the flow rate of the processing liquid flowing through the branch line 112 by the motor needle valve 23 at the above-described third cycle P3. The time interval of the third cycle may be equal to the time interval of the first cycle P1 that is the flow rate measurement cycle of the flow meter 22.

Further, when the first section range A1 is set as the second range R2 and the second section range A2 is set as the third range R3, the controller 24 adjusts the flow rate of the processing liquid flowing through the branch line 112 as described below. That is, when the flow rate of the processing liquid flowing through the branch line 112 as indicated by the measurement result of the flow meter 22 is included in the first section range A1 (i.e., the second range R2), the controller 24 adjusts the flow rate of the processing liquid flowing through the branch line 112 by the motor needle valve 23 at the above-described second cycle P2. Meanwhile, when the flow rate of the processing liquid flowing through the branch line 112 as indicated by the measurement result of the flow meter 22 is included in the second section range A2 (i.e., the third range R3), the controller 24 adjusts the flow rate of the processing liquid flowing through the branch line 112 by the motor needle valve 23 at a third cycle P3 having a time interval shorter than the time interval of the above-described second cycle P2. The time interval of the third cycle may be equal to the time interval of the first cycle P1 that is the flow rate measurement cycle of the flow meter 22.

As described above, the range in which the flow rate adjustment by the motor needle valve 23 is not performed (see the first range R1 in FIG. 4) is not indispensable. Similarly, the range in which the flow rate adjustment by the motor needle valve 23 is performed at the same cycle as the flow rate measurement cycle by the flow meter 22 (see the first range R3 in FIG. 4) is not indispensable.

Further, when the operation mode in which the flow rate of the processing liquid flowing through the branch line 112 easily deviates from the set flow rate P is known in advance, during that time, regardless of the measurement result of the flow meter 22, the time interval of the flow rate adjustment cycle by the motor needle valve 23 may be set to be short so as to prevent the flow rate of the processing liquid from deviating from the set flow rate P. Specifically, the controller 24 may adjust the flow rate of the processing liquid flowing through the branch line 112 by the motor needle valve 23 at least during a period in which the operation mode of the liquid processing apparatus is in a preset first operation mode, regardless of the measurement result of the flow meter 22, at a fourth cycle having a time interval shorter than the time interval of the second cycle P2. The time interval of the fourth cycle may be equal to the time interval of the first cycle P1 that is the flow rate measurement cycle of the flow meter 22.

Figure 10:
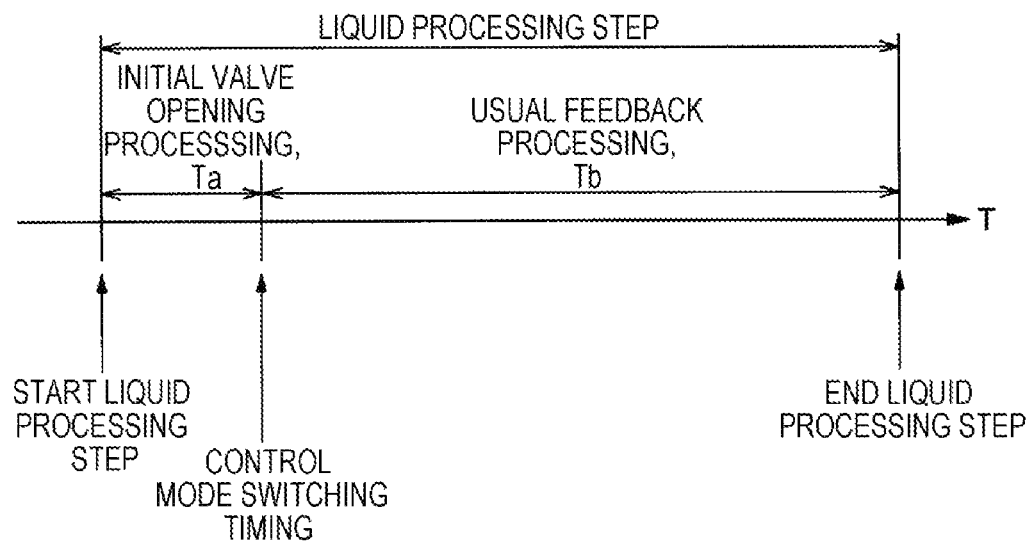
FIG. 10 is a schematic view illustrating an outline of a liquid processing step.

FIG. 10 is a schematic diagram illustrating a liquid processing step. In the liquid processing step illustrated in FIG. 10, the above-described initial valve opening processing Ta is performed together with the start of the liquid processing step. Then, at the control mode switching timing, the operation mode shifts from the initial valve opening processing Ta to the usual feedback processing Tb. Then, the usual feedback processing Tb is performed until the end of the liquid processing step. In the above-described exemplary embodiment, the feedback control of the motor needle valve 23 is not performed during the initial valve opening processing Ta, and the opening degree of the motor needle valve 23 is fixed to the preset opening degree, but the feedback control of the motor needle valve 23 may be also performed during the initial valve opening processing Ta. In particular, as the information regarding the execution timing of the initial valve opening processing Ta is input to the controller 24, the controller 24 may grasp the execution timing of the initial valve opening processing Ta in advance. Therefore, the initial valve opening processing Ta may be set as the period of the above-described first operation mode, and during the period in which the initial valve opening processing Ta is performed, the controller 24 may control the motor needle valve 23 to perform the flow rate adjustment of the processing liquid at the above-described fourth cycle regardless of the measurement result of the flow meter 22. Accordingly, even in the initial valve opening processing Ta (see symbol "D1" in FIG. 4) in which the flow rate of the processing liquid easily deviates from the set flow rate P, the flow rate of the processing liquid may be adjusted to be close to the set flow rate P so as to perform a liquid processing properly.

Further, the period of the above-described first operation mode is not limited to the initial valve opening processing Ta, and an arbitrary processing may be set as the period of the above-described first operation mode. For example, as illustrated in FIG. 1, in a case where a plurality of processing units 16 are connected to one tank 102, the timing at which the liquid processing step of another processing unit 16 is started during the liquid processing step of a certain processing unit 16 and the preset period before and/or after the timing may be set as the period of the above-described first operation mode. Further, when a plurality of processing tanks 102 are connected to one processing unit, the timing at which the tank 102 serving as a substantial processing liquid source to the processing unit 16 is switched and the preset period before and/or after the timing may be set as the period of the above-described first operation mode.

In addition, in the above-described exemplary embodiment, a description has been made of the case where the flow rate measurement by the flow meter 22 and the flow rate adjustment by the motor needle valve 23 are performed on processing liquids such as, for example, DHF, but fluids other than processing liquids may be objects of the measurement and adjustment. For example, even when the flow rate of a rinsing liquid such as DIW or other fluid is measured by the flow meter 22 and adjusted by the motor needle valve 23, the liquid processing apparatus and the liquid processing method similar to the above-described exemplary embodiment and modifications may be used.

Further, in the above-described exemplary embodiment, a description has been made of the case where the motor needle valve is used as a flow rate adjustment mechanism. However, even when the flow rate of fluids such as, for example, processing liquids is adjusted by other mechanisms, the processing may be performed using the above-described exemplary embodiment and modifications.

As described above, in the above-described exemplary embodiment and modifications, when the measurement result of the flow meter 22 indicates that the flow rate of the fluid (e.g., processing liquid) flowing through the supply line (branch line 112) is included in the preset range, the flow rate of the fluid flowing through the supply line is adjusted by the flow rate adjustment mechanism (motor needle valve 23) at a cycle having a time interval longer than the time interval of the first cycle P1. The phrase "the flow rate of the fluid flowing through the supply line is adjusted by the flow rate adjustment mechanism at a cycle having a time interval longer than the time interval of the first cycle P1" as described herein includes not only the case where the flow rate adjustment of the fluid is actively performed as in the above-described second range R2, but also the case where the flow rate adjustment of the fluid is not actively performed as in the above-described first range R1 (i.e., the case where the flow rate adjustment cycle has an infinite time interval).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a fluid supply configured to supply a fluid to a substrate;
   a supply line configured to supply the fluid to the fluid supply;
   a flow meter configured to measure a flow rate of the fluid flowing through the supply line;
   a flow rate adjuster provided in the supply line and configured to adjust the flow rate of the fluid flowing through the supply line; and
   a controller programmed to control the flow rate adjuster based on a measurement result of the flow meter,
   wherein the controller receives the measurement result of the flow meter for each of a plurality of first time intervals of a first cycle and when the measurement result of the flow meter indicates that the flow rate of the fluid flowing through the supply line falls within a preset first range extending above and below the preset flow rate, the controller continuously receives measurement results for each of the first time intervals of the first cycle without performing a flow rate adjustment,
   when the measurement result of the flow meter indicates that the flow rate of the fluid flowing through the supply line as indicated by the measurement result of the flow meter falls within a preset second range outside the preset first range, the preset second range extending above and below the preset first range, the controller causes the flow rate adjuster to adjust the flow rate of the fluid flowing through the supply line at a second time interval longer than one of the first time intervals of the first cycle,
   when the measurement result of the flow meter indicates that the flow rate of the fluid flowing through supply line as indicated by the measurement result of the flow meter falls within a preset third range outside the preset second range, the preset third range extending above and below the preset second range, the controller causes the flow rate adjuster to adjust the flow rate of the fluid flowing through the supply line at a third time interval shorter than the second time interval and equal to the one first time interval, the preset third range including a state in which the processing fluid does not flow through the supply line, and
   wherein the first time interval of the first cycle is constant and does not change when the measurement result of the flow meter indicates that the flow rate of the fluid flowing through the supply line as indicated by the measurement result of the flow meter falls within any of the preset first range, the preset second range, and the preset third range.

2. The liquid processing apparatus of claim 1, wherein the controller causes the flow rate adjuster to adjust the flow rate of the fluid flowing through the supply line substantially simultaneously with the timing of receiving the measurement result of the flow meter indicating that the flow rate of the fluid flowing through the supply line is included in the preset third range.

3. The liquid processing apparatus of claim 1, wherein the controller determines a timing of adjusting the flow rate adjuster based on a timing of receiving the measurement result of the flow meter indicating that the flow rate of the fluid flowing through the supply line is shifted from a state of not being included in the preset second range to a state of being included in the preset second range, and causes the flow rate adjuster not to adjust the flow rate of the fluid flowing through the supply line substantially simultaneously with at least the timing of receiving the measurement result.

4. The liquid processing apparatus of claim 1, wherein the controller causes the flow rate adjuster to adjust the flow rate of the fluid flowing through the supply line at a fourth time interval at least during a period in which an operation mode of the liquid processing apparatus is in a preset first operation mode, without consideration of the measurement result of the flow meter, the fourth time interval being shorter than the second time interval.

5. The liquid processing apparatus of claim 4, wherein the fourth time interval is equal to the first time interval of the first cycle.

6. The liquid processing apparatus of claim 1, wherein the controller controls the flow rate adjuster based on the measurement result of the flow meter such that the flow rate of the fluid flowing through the supply line approaches a set flow rate.

7. A liquid processing method comprising:
   supplying a fluid to a fluid supply through a supply line and supplying the fluid from the fluid supply to a substrate;
   measuring a flow rate of the fluid flowing through the supply line by a flow meter;

receiving, by a controller, a measurement result of the flow meter for each of a plurality of first time intervals of a first cycle; and adjusting the flow rate of the fluid flowing through the supply line by a flow rate adjuster controlled by the controller, based on the measurement result of the flow meter, wherein, when the measurement result of the flow meter indicates that the flow rate of the fluid flowing through the supply line falls within a preset first range extending above and below the preset flow rate, the controller continuously receives measurement results at each of the first time intervals of the first cycle without performing a flow rate adjustment, when the measurement result of the flow meter indicates that the flow rate of the fluid flowing through the supply line as indicated by the measurement result of the flow meter falls within a preset second range outside the preset first range, the preset second range extending above and below the preset first range, the controller causes the flow rate adjuster to adjust the flow rate of the fluid flowing through the supply line at a second time interval longer than one of the first time intervals of the first cycle, when the measurement result of the flow meter indicates that the flow rate of the fluid flowing through supply line as indicated by the measurement result of the flow meter falls within a preset third range outside the preset second range, the preset third range extending above and below the preset second range, the controller causes the flow rate adjuster to adjust the flow rate of the fluid flowing through the supply line at a third time interval shorter than the second time interval and equal to the one first time interval, the preset third range including a state in which the processing fluid does not flow through the supply line, and wherein the first time interval of the first cycle is constant and does not change when the measurement result of the flow meter indicates that the flow rate of the fluid flowing through the supply line as indicated by the measurement result of the flow meter falls within any of the preset first range, the preset second range, and the preset third range.

8. The liquid processing apparatus of claim 1, wherein in the preset second range, the first time interval of the first cycle is one tenth the second time interval.

* * * * *